United States Patent
Rosen

(10) Patent No.: US 7,132,867 B1
(45) Date of Patent: Nov. 7, 2006

(54) HIGH RESOLUTION DIGITAL LOOP CIRCUIT

(75) Inventor: Eitan Rosen, Abirim (IL)

(73) Assignee: Marvell Semiconductor Israel Ltd., Yokneam (IL)

( * ) Notice: Subject to any disclaimer, the term of this patent is extended or adjusted under 35 U.S.C. 154(b) by 10 days.

(21) Appl. No.: 11/111,095

(22) Filed: Apr. 19, 2005

Related U.S. Application Data

(60) Provisional application No. 60/613,953, filed on Sep. 27, 2004.

(51) Int. Cl.
    *H03L 7/06* (2006.01)
(52) U.S. Cl. ..................... 327/159; 327/150
(58) Field of Classification Search ............. None
    See application file for complete search history.

(56) References Cited

U.S. PATENT DOCUMENTS

| | | | |
|---|---|---|---|
| 5,812,619 A | 9/1998 | Runaldue | 375/376 |
| 6,348,823 B1 | 2/2002 | Pan | 327/159 |
| 6,449,327 B1 | 9/2002 | Rosen | 377/33 |
| 6,680,874 B1 | 1/2004 | Harrison | 365/233 |
| 6,711,226 B1 | 3/2004 | Williams et al. | 375/371 |
| 6,952,124 B1 * | 10/2005 | Pham | 327/156 |

* cited by examiner

*Primary Examiner*—Timothy P. Callahan
*Assistant Examiner*—Cassandra Cox

(57) ABSTRACT

A digital feedback loop circuit achieves a resolution as good as the intrinsic resolution of the delay element of the circuit, notwithstanding the presence of a feedback counter/divider of integer value N that might otherwise be expected to multiply the minimum resolution by N. Output altering circuitry is used to alter the error feedback signal for M out of every N feedback cycles in such a way that the overall delay over N cycles can be controlled to within the resolution of the delay element. In one embodiment, the output altering circuitry includes a second counter whose maximum value is controllable and that outputs a signal whose value changes after its current maximum value has been reached. In another embodiment, the output altering circuitry includes a lookup table preloaded with sequences of output signals, with the sequence selected by a controller.

36 Claims, 7 Drawing Sheets

HIGH RESOLUTION DIGITAL LOOP CIRCUIT

CROSS REFERENCE TO RELATED APPLICATION

This claims the benefit of copending U.S. Provisional Patent Application No. 60/613,953, filed Sep. 27, 2004.

BACKGROUND OF THE INVENTION

This invention relates to a digital phase-locked loop circuit or delay-locked loop circuit. More particularly, this invention relates to such a circuit having improved resolution.

Feedback loop circuits, including phase-locked loops (PLLs) and delay-locked loops (DLLs), are well known. In such circuits, an output signal is fed back to a detector (e.g., a phase-frequency detector in a PLL or a phase detector in a DLL) that also samples a reference signal. If the output does not bear the desired relationship to the reference signal, the detector generates a signal that causes the output signal generator (e.g., a variable frequency oscillator in a PLL or a variable delay line in a DLL) to vary its output to bring it closer to the desired relationship. This continues until the output signal locks to the reference signal. In a digital loop circuit, the signal generated by the detector is converted by a digital controller into a digital control word that conveys to the output signal generator the amount of delay required to achieve a signal lock.

For frequency synthesis, the feedback loop may include a feedback counter with an integer value N that has the effect of multiplying the output frequency of the signal by N. This is achieved by counting N cycles for each reference cycle. In the case of a digital loop circuit, assuming that the loop circuit (i.e., its delay element) has a certain intrinsic temporal resolution $\Delta t$, the effective resolution of the loop circuit becomes $N\Delta t$. This degrades the locking performance of the digital loop circuit or, alternatively, requires much higher precision components to achieve the same resolution.

It therefore would be desirable to be able to use a feedback counter for frequency synthesis in a digital loop circuit while maintaining the intrinsic resolution of the circuit.

SUMMARY OF THE INVENTION

The present invention provides a digital loop circuit that maintains its intrinsic resolution notwithstanding the presence of the counter/divider in the feedback loop. This is accomplished by providing circuitry to alter the digital control word for some subset (including M cycles, where M<N) of the N cycles. For example, the altered digital control word might indicate a delay that is one $\Delta t$ longer than the delay otherwise indicated by the control word. By mixing M occurrences of a first delay and N−M occurrences of a second delay, an effective delay having the desired resolution is achieved.

In a digital loop circuit of the type described above, where the detector output is processed by a controller to generate a digital control word that instructs the variable delay element how long to delay the feedback signal, an element, such as a shifter or an adder, is provided to increment the digital control word by a desired increment amount. As directed by the controller, for up to M cycles out of each N cycles, the incremented digital control word is used in place of the control word determined by the detector. The desired increment amount and M are chosen so that the total delay, resulting from M incremented delays and N−M unincremented delays, has the desired delay. Normally, the increment amount would be chosen in advance and fixed, while M would be determined by the controller, although it is possible that the increment amount also could be controllable.

Thus, in accordance with the present invention there is provided a digital feedback loop circuit including a controllable output signal generator for generating a loop circuit output signal, a feedback line that feeds the output signal back to an input of the loop circuit, a feedback counter in the feedback line for dividing the fed-back loop circuit output signal by an integer N, and a detector for comparing the divided loop circuit output signal to an input reference signal and generating a comparison signal. The loop circuit experiences N loop cycles for each cycle of the input reference signal. The digital loop circuit further includes a controller for operating on the comparison signal and generating an output control signal for adjusting the controllable output signal generator for locking the loop circuit output signal to the input reference signal, and circuitry for selectably altering the output control signal to adjust delay of the loop circuit output signal. The latter circuitry includes a control signal modifier that operates on the output control signal to produce a modified control signal, a selector for controllably inputting to the controllable output signal generator one of the output control signal and the modified control signal, and a resettable counter for causing the selector to select the altered control signal for M loop cycles (M<N) and to select the output control signal for N−M loop cycles. M preferably is selected by the controller, as described in more detail below.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1–7.

Figure 1:
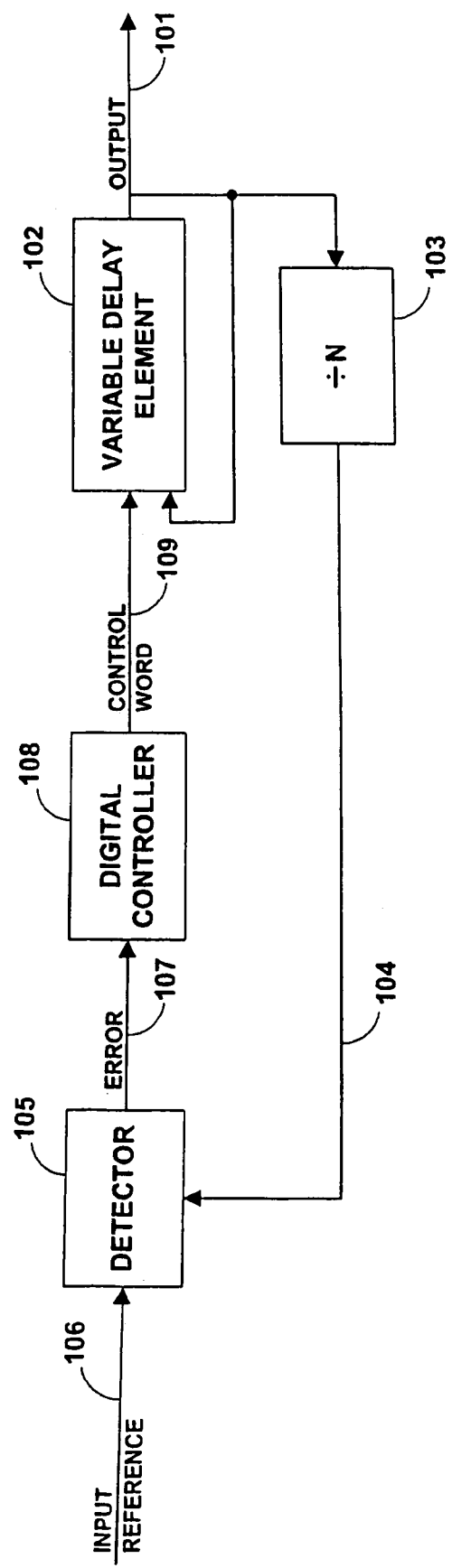
FIG. 1 is a schematic representation of a known digital phase-locked loop circuit.

FIG. 1 shows a known digital phase-locked loop circuit 100. An output signal 101 is generated by an inverting variable delay element 102. In the case of a PLL, inverting variable delay element 102 typically is a ring oscillator. In the case of a DLL, inverting variable delay element 102 typically would be a variable delay line. Output signal 101 is fed back through counter/divider 103 which divides signal 101 by an integer value N stored in counter/divider 103. This has the effect of multiplying the output frequency by N—i.e., of causing the output frequency to be N times the reference frequency.

The divided feedback signal 104 is input, in the case of a PLL, to a phase/frequency detector 105 along with an input reference signal 106. In the case of a DLL, this would be a phase detector. Detector 105 outputs an error signal 107 indicative of whether the phase should be advanced or retarded. Error signal 107 is input to a digital controller 108 which compares the current error signal 107 to past samples of error signal 107 and outputs a digital control word 109 which is input to variable delay element 102 to vary its output 101 to advance or retard the phase as indicated by that comparison. In the case of a PLL, element 102 preferably is an inverting variable delay element, while in the case of a DLL, element 102 preferably is non-inverting variable delay line.

As stated above, circuit 100 has the difficulty that the operation of feedback counter 103 causes circuit 100 to go through N cycles for each cycle of reference signal 106, multiplying the output frequency, but also the output resolution, by N. Thus, if the intrinsic resolution of circuit 100 (i.e., of delay element 102) is Δt, the resolution of circuit 100 becomes NΔt. For example, if the intrinsic resolution is 1 ps, which is typical of a delay element of between 300 ps and 600 ps, the effective resolution is N ps (N≧1).

The present invention overcomes this degradation in resolution by providing additional circuitry in a digital loop circuit to alter the control signal output by the digital controller in such a way as to select the desired resolution. The additional circuitry includes a control signal modifier that modifies the digital control word so that is represents a different amount of delay, as well as selection circuitry that selects the modified digital control word for M of the N cycles (0≦M≦N−1) and the unmodified digital control word for N−M of the N cycles. This allows the delay to be controlled to any desired integral multiple, up to N−1, of the difference between the modified and unmodified control words. Therefore, the resolution of the circuit becomes that difference, which can be made equal to the intrinsic resolution of the delay element. Thus, if the signal modifier increases the delay represented by the digital control word by, e.g., 1 ps, then the delay of the circuit will be any multiple of 1 ps, depending on how many cycles out of N cycles the modified control signal is used, allowing a resolution as small as 1 ps.

For example, with N=10, a target delay of 500 ps, and an altered delay of 501 ps, 1×501+9×500=5001 (the M=1 case), 2×501+8×500=5002 (the M=2 case), etc., allowing control of total delay in 1 ps increments, or a resolution of 1 ps.

Figure 2:
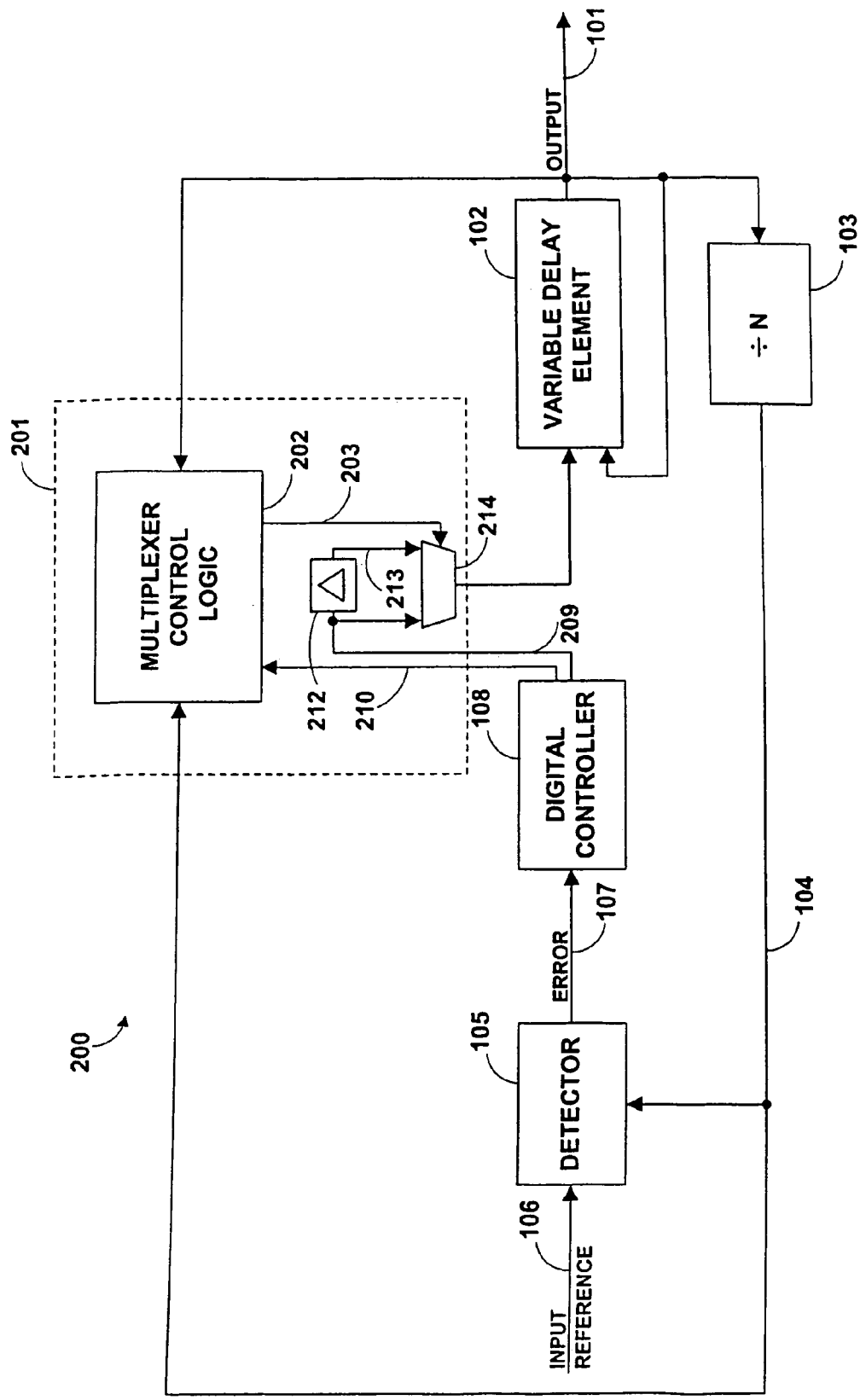
FIG. 2 is a schematic diagram of a digital phase-locked loop circuit in accordance with the invention.

FIG. 2 shows a preferred embodiment of a modified digital loop circuit 200 in accordance with the invention. Circuit 200 preferably is similar to circuit 100, with the preferable addition of control signal altering circuitry 201, and the preferable substitution of digital controller 208 for digital controller 108. Digital controller 208 preferably is similar to digital controller 108 in that it preferably outputs digital control word 209, similar to digital control word 109. Digital controller 208 preferably also outputs a control signal 210 that sets M.

Preferably, M is selected such that if more delay is required (i.e., to reduce the frequency or retard the phase) then M is incremented (e.g., by 1, or more, depending on magnitude of the phase error and previous errors). If M becomes equal to N then N is incremented and M is set to zero (a modulo operation). If less delay is required (i.e., to increase the frequency or advance the phase) then M is reduced. If M needs to become smaller than zero (e.g., −1), then N is decremented by 1 and M is made equal to N−1.

Signal altering circuitry 201 preferably also includes a control word modifier 212, a selector 214 (which preferably is a multiplexer) for selecting between digital control word 209 and modified control word 213, and multiplexer control logic 202 which outputs a signal 203 that determines when selector 214 selects the unmodified control word 209 and modified control word 213 based on signals 101, 104 and 210.

Control word modifier 212 preferably is a shifter, but may be any component that adds an increment to digital control word 209 to create modified control word 213. In a preferred embodiment, the increment is equal to the intrinsic resolution of delay element 102.

Figure 3:
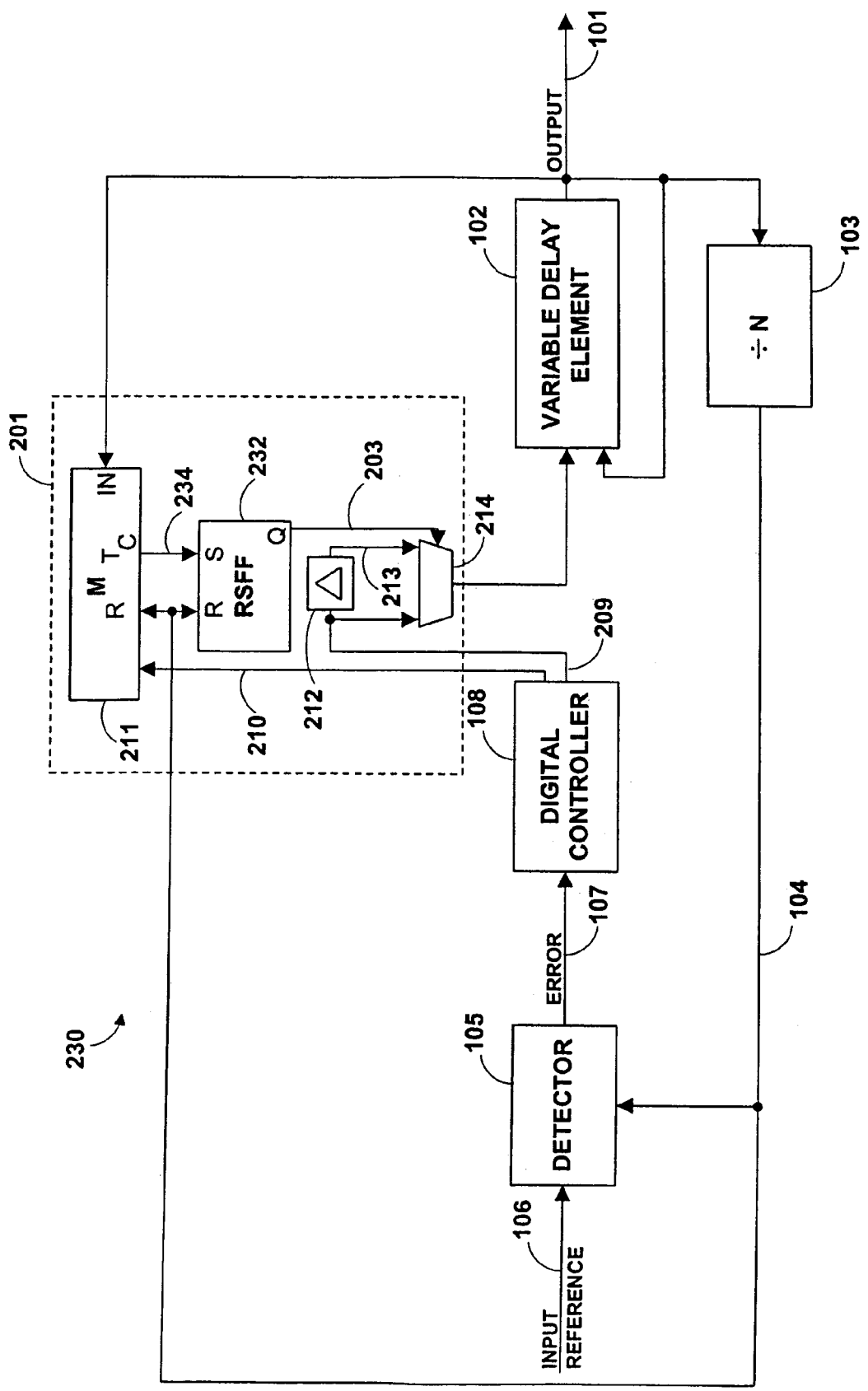
FIG. 3 is a schematic diagram of a first preferred embodiment of the circuit of FIG. 2.

FIG. 3 shows an embodiment 230 of circuit 200 in which multiplexer control logic 202 includes an additional counter 211 and a set-reset flip-flop 232. Both counter 211 and flip-flop 232 preferably are reset by the rising edge of feedback signal 104. Flip-flop 232 preferably is set to output a signal that causes selector 214 to select modified control word 213 as long as the output 234 of counter 211 is between 0 and M (i.e., for M out of N cycles), inclusive, and to select original digital control word 209 when output 234 is between M+1 and N (i.e., for N−M out of N cycles). As described above, this allows the delay to be controlled to any multiple, up to M, of the selected increment added by control word modifier 212.

Figure 4:
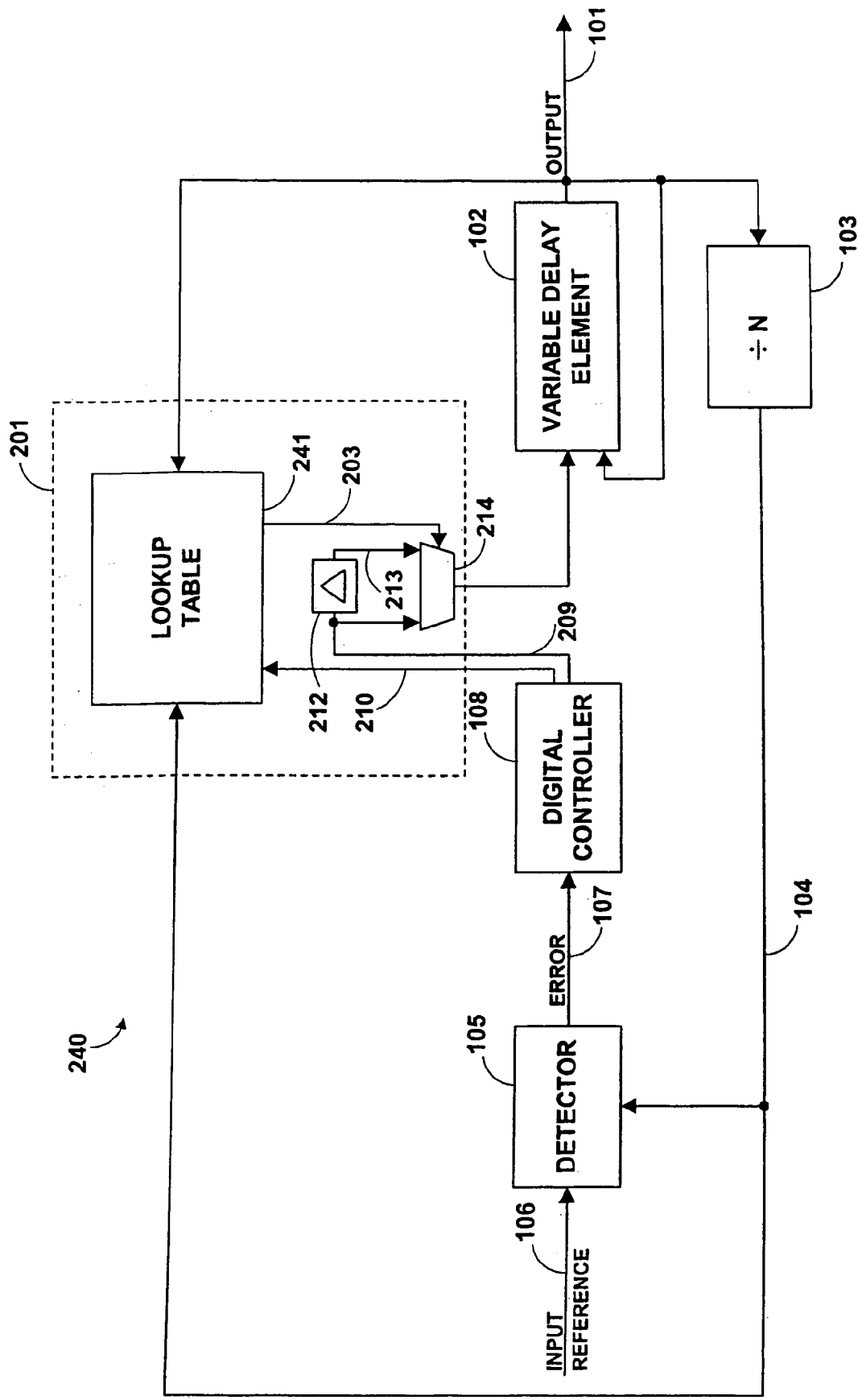
FIG. 4 is a schematic diagram of a second preferred embodiment of the circuit of FIG. 2.

FIG. 4 shows an embodiment 240 of circuit 200 in which multiplexer control logic 202 includes a lookup table 241 which preferably is preloaded with N sequences of output signals, each of which selects a different number, between 0 and N−1, of occurrences of modified digital control word 213. The sequence that is in effect is determined by the value M of signal 210, and preferably is loaded based on signal 104 (e.g., on each rising edge thereof). Individual values in the sequence preferably are clocked out based on signal 101 (e.g., on each falling edge thereof).

One possible set of sequences in the lookup table is as follows, with "0" representing the original control word 209 and "1" representing the modified control word 213:

| M | Sequence |
|---|----------|
| 0 | 00000000 |
| 1 | 10000000 |
| 2 | 10001000 |
| 3 | 10101000 |
| 4 | 10101010 |
| 5 | 11101010 |
| 6 | 11101110 |
| 7 | 11111110 |

It will be appreciated from this set of sequences that whereas in embodiment 230, the M occurrences of modified control word 213 occurred consecutively, followed by N−M consecutive occurrences of original control word 209, in embodiment 240, the M occurrences of modified control word 213 are scattered more uniformly among the N−M occurrences of original control word 209.

Figure 5:
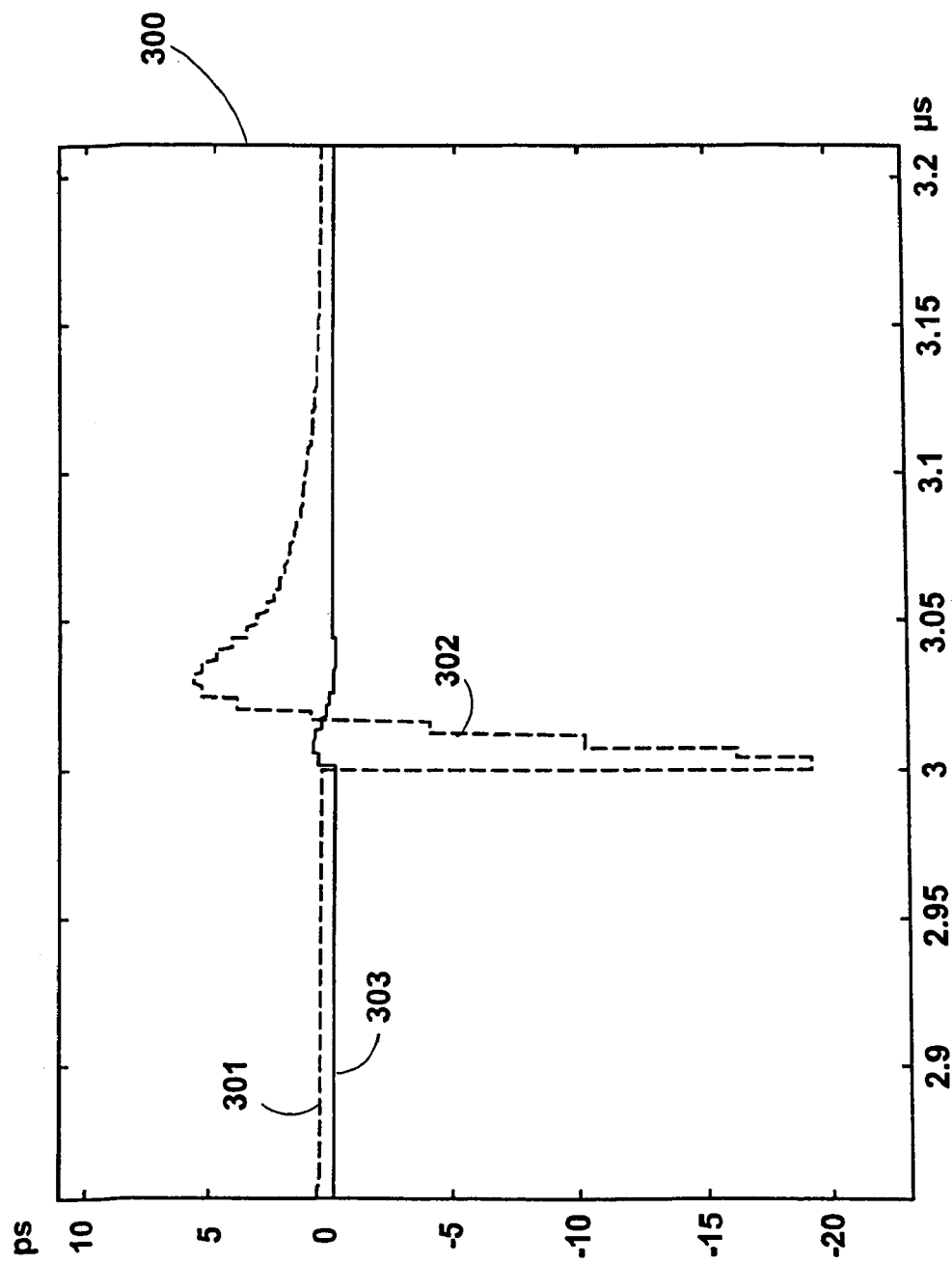
FIG. 5 is a plot illustrating the performance of an idealized digital loop circuit in accordance with the present invention.

FIG. 5 shows the results 300 of a simulation, prepared using MATLAB® software available from The MathWorks, Inc., of Natick, Mass. This simulation assumes an ideal digital delay element and an ideal digital phase detector, having infinite accuracy similar to analog circuitry. The target delay is 500 ps.

In graph 300, with the abscissa in microseconds and the ordinate in picoseconds, trace 301 (dashed) is the phase error, and shows a 20 ps phase step 302. Trace 303 (solid) is the difference between the output delay and the target delay. As can be seen, during the duration of less than 0.05 As of phase step 302, the output delay is well within 1 ps of the target delay. Factors unrelated to the present invention, such as supply noise modulation, may prevent the delay from being precisely on target.

Figure 6:
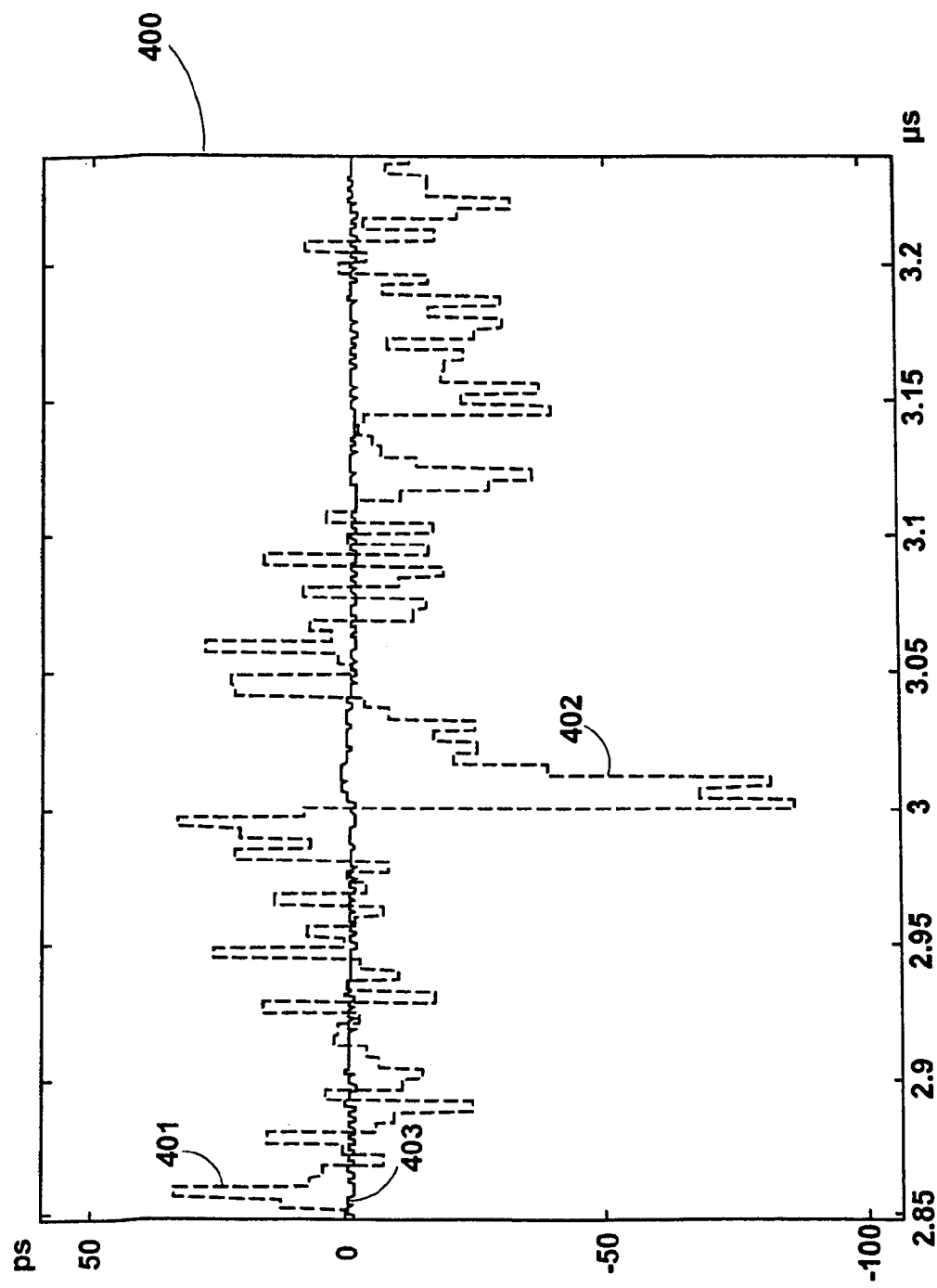
FIG. 6 is a plot illustrating the performance of a non-idealized digital loop circuit in accordance with the present invention.
Figure 7:
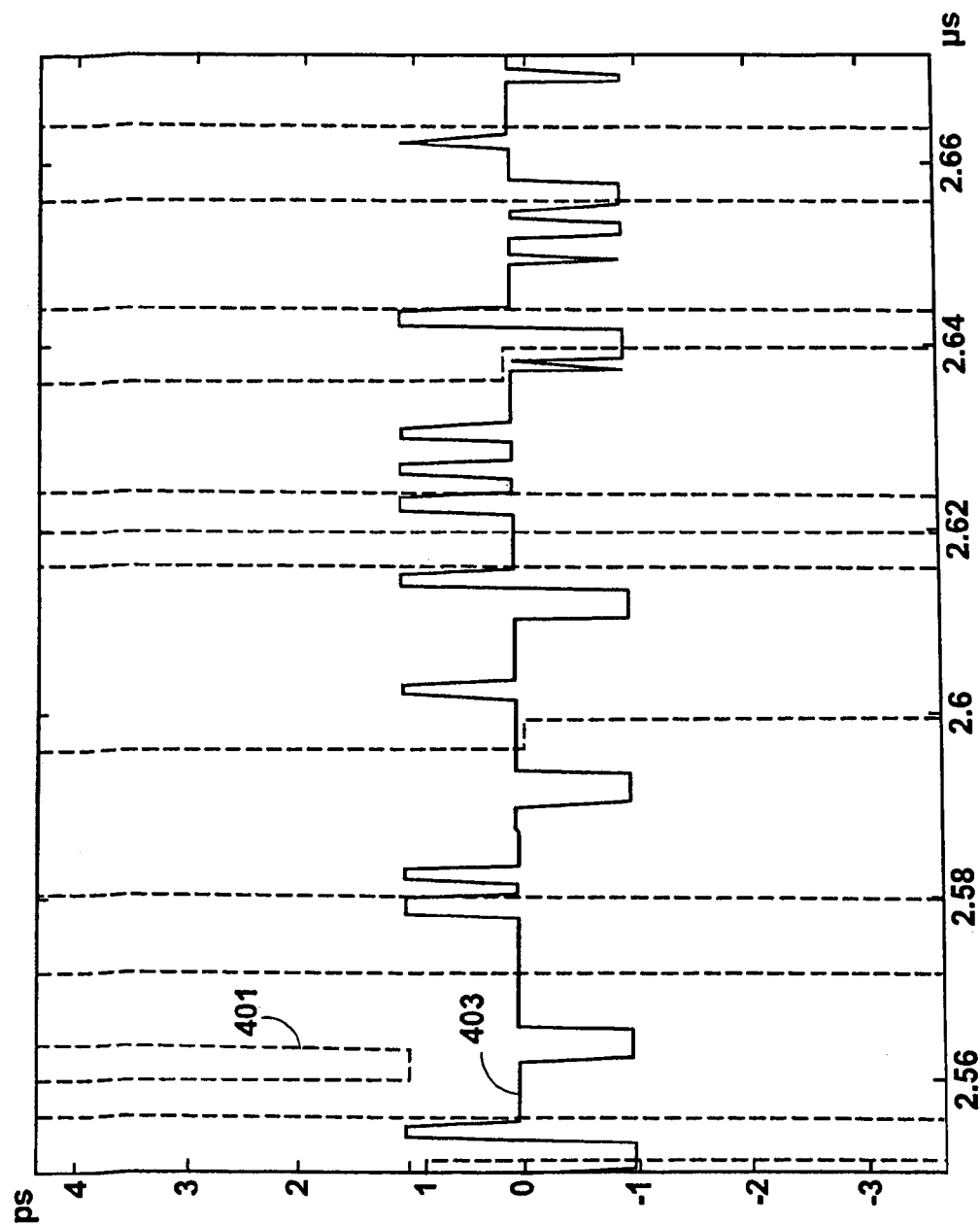
FIG. 7 is an enlarged representation of another portion of the plot of FIG. 6.

FIGS. 6 and 7 show a MATLAB® simulation of an actual, non-idealized circuit similar to that described in connection with FIG. 2. Once again, the abscissa is in microseconds and the ordinate is in picoseconds. Trace 401 (dashed) is the phase error, and shows a 100 ps phase step 402. Trace 403 (solid) is the difference between the output delay and the target delay. As can be seen, particularly in FIG. 5, which is an enlarged drawing of another portion of the simulation depicted in FIG. 4, quick 1 ps delay variations keep the delay on target as the phase error changes.

Thus it is seen that a digital loop circuit that allows control of resolution down to the intrinsic resolution of the delay element in the circuit has been provided. It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A digital feedback loop circuit comprising:
   a controllable output signal generator to generate a loop circuit output signal, said controllable output signal generator having an intrinsic resolution;
   a feedback counter to divide said loop circuit output signal by an integer N;
   a detector to compare said divided loop circuit output signal to an input reference signal and generate a comparison signal, N loop cycles occurring for each cycle of said input reference signal;
   a controller responsive to said comparison signal to generate an output control signal to adjust said controllable output signal generator to lock said loop circuit output signal to said input reference signal; and
   circuitry to selectably alter said output control signal to adjust resolution of said loop circuit output signal; said circuitry comprising:
   a control signal modifier responsive to said output control signal to produce a modified control signal;
   a selector to select one of said output control signal and said modified control signal as an input to said controllable output signal generator for M loop cycles (M<N) and to select said output control signal for N−M loop cycles.

2. The digital feedback loop circuit of claim 1 further comprising selector control logic to control said selector.

3. The digital feedback loop circuit of claim 2, wherein:
   said digital feedback loop circuit is one of (a) a digital phase-locked loop and (b) a digital delay-locked loop;
   said controllable output signal generator comprises an inverting variable delay element;
   said detector comprises one of (1) a phase-frequency detector and (2) a phase detector;
   said controller is a digital control circuit and said output control signal is a digital control word specifying a base delay to said inverting variable delay element; and
   said control signal modifier outputs a modified control word bearing a predetermined relationship to said digital control word and specifying a modified delay to said inverting variable delay element, said modified delay bearing a predetermined relationship to said base delay; whereby:
   output delay of said inverting variable delay element in one reference cycle is a sum of N−M cycles of said base delay and M cycles of said modified delay; and
   resolution of said output delay is controlled to within a desired repetition of said predetermined relationship of said modified delay to said base delay.

4. The digital feedback loop circuit of claim 3, wherein said predetermined relationship is substantially equal to said intrinsic resolution.

5. The digital feedback loop circuit of claim 3, wherein said selector comprises a multiplexer.

6. The digital feedback loop circuit of claim 5 wherein said selector control logic comprises:
   a resettable counter whose maximum value is set by said controller; and
   a set-reset flip-flop circuit that outputs a multiplexer control signal having first state until said resettable counter reaches said maximum value and a second state after said resettable counter reaches said maximum value.

7. The digital feedback loop circuit of claim 5 wherein:
   said selector control logic comprises a lookup table that outputs a multiplexer control signal according to one of a plurality of preloaded sequences; and
   said controller outputs a sequence selection signal that selects said one of said preloaded sequences.

8. The digital feedback loop circuit of claim 1, wherein M is selected by said controller.

9. The digital feedback loop circuit of claim 1 further comprising a variable delay element responsive to said loop circuit output signal.

10. The digital feedback loop circuit of claim 9 wherein said feedback counter is responsive to said variable delay element.

11. The digital feedback loop circuit of claim 1 wherein said detector comprises one of (a) a phase-frequency detector and (b) a phase detector.

12. The digital feedback loop circuit of claim 1 wherein said controllable output signal generator is responsive to a variable delay element.

13. A digital feedback loop circuit comprising:
   means for controllably generating a loop circuit output signal, said means for controllably generating an output signal having an intrinsic resolution;
   means for dividing said loop circuit output signal by an integer N;
   means for comparing said divided loop circuit output signal to an input reference signal and generating a comparison signal, N loop cycles occurring for each cycle of said input reference signal;
   means responsive to said comparison signal for generating an output control signal to adjust said means for controllably generating a loop circuit output signal for locking said loop circuit output signal to said input reference signal; and
   means for selectably altering said output control signal to adjust resolution of said loop circuit output signal; said means for selectably altering comprising:

means responsive to said output control signal for producing a modified control signal;

means for selecting one of said output control signal and said modified control signal as an input to said means for controllably generating a loop circuit output signal for M loop cycles (M<N) and for selecting said output control signal for N–M loop cycles.

14. The digital feedback loop circuit of claim 13 further comprising means for controlling said means for selecting.

15. The digital feedback loop circuit of claim 14, wherein:
said digital feedback loop circuit is one of (a) a digital phase-locked loop and (b) a digital delay-locked loop;
said means for controllably generating a loop circuit output signal comprises an inverting variable delay means;
said means for comparing comprises one of (1) a phase-frequency detector and (2) a phase detector;
said means responsive to said comparison signal is a digital control circuit and said output control signal is a digital control word specifying a base delay to said inverting variable delay means; and
said means responsive to said output control signal outputs a modified control word bearing a predetermined relationship to said digital control word and specifying a modified delay to said inverting variable delay means, said modified delay bearing a predetermined relationship to said base delay; whereby:
output delay of said inverting variable delay means in one reference cycle is a sum of N–M cycles of said base delay and M cycles of said modified delay; and
resolution of said output delay is controlled to within a desired repetition of said predetermined relationship of said modified delay to said base delay.

16. The digital feedback loop circuit of claim 15, wherein said predetermined relationship is substantially equal to said intrinsic resolution.

17. The digital feedback loop circuit of claim 15, wherein said means for selecting comprises multiplexer means.

18. The digital feedback loop circuit of claim 17 wherein said means for controlling said selector comprises:
resettable means for counting whose maximum value is set by said means responsive to said comparison signal; and
set-reset flip-flop means that outputs a multiplexer control signal having first state until said resettable means for counting reaches said maximum value and a second state after said resettable means for counting reaches said maximum value.

19. The digital feedback loop circuit of claim 17 wherein:
said means for controlling said selector comprises means for outputting a multiplexer control signal according to one of a plurality of preloaded sequences; and
said means responsive to said comparison signal outputs a sequence selection signal that selects said one of said preloaded sequences.

20. The digital feedback loop circuit of claim 13, wherein M is selected by said means responsive to said comparison signal.

21. The digital feedback loop circuit of claim 13 further comprising a variable delay means responsive to said loop circuit output signal.

22. The digital feedback loop circuit of claim 21 wherein said means for dividing is responsive to said variable delay means.

23. The digital feedback loop circuit of claim 13 wherein said means for comparing comprises one of (a) a phase-frequency detector and (b) a phase detector.

24. The digital feedback loop circuit of claim 13 wherein said means for controllably generating a loop circuit output signal is responsive to a variable delay means.

25. A method for operating a digital feedback loop circuit, said method comprising:
controllably generating a loop circuit output signal, said output signal having an intrinsic resolution;
dividing said loop circuit output signal by an integer N and feeding back said divided loop circuit output signal;
comparing said divided loop circuit output signal to an input reference signal and generating a comparison signal, N loop cycles occurring for each cycle of said input reference signal;
responsive to said comparison signal, generating an output control signal for locking said loop circuit output signal to said input reference signal; and
selectably altering said output control signal to adjust resolution of said loop circuit output signal; said selectably altering comprising:
responsive to said output control signal, producing a modified control signal;
selecting one of said output control signal and said modified control signal as an input for controllably generating a loop circuit output signal for M loop cycles (M<N) and for selecting said output control signal for N–M loop cycles.

26. The method of claim 25 further comprising controlling said selecting.

27. The method of claim 26, wherein:
said digital feedback loop circuit is one of (a) a digital phase-locked loop and (b) a digital delay-locked loop;
said controllably generating a loop circuit output signal comprise applyings an inverting variable delay;
said generating an output control signal comprises specifying a base delay to said inverting variable delay means; and
said producing a modified control signal comprises outputting a modified control word bearing a predetermined relationship to said digital control word and specifying a modified delay bearing a predetermined relationship to said base delay; whereby:
output delay in one reference cycle is a sum of N–M cycles of said base delay and M cycles of said modified delay; and
resolution of said output delay is controlled to within a desired repetition of said predetermined relationship of said modified delay to said base delay.

28. The method of claim 27, wherein said predetermined relationship is substantially equal to said intrinsic resolution.

29. The method of claim 27, wherein said selecting comprises controlling a multiplexer.

30. The method of claim 29 wherein said controlling said multiplexer comprises:
resettably counting to a maximum value set by responsive to said comparison signal; and
outputting a multiplexer control signal having a first state until said resettable counting reaches said maximum value and a second state after said resettable counting reaches said maximum value.

31. The method of claim 29 wherein:
said controlling said multiplexer comprises outputting a multiplexer control signal according to one of a plurality of preloaded sequences; and
said one of said preloaded sequences is selected responsive to comparision signal.

32. The method of claim 25 further comprising selecting M responsive to said comparison signal.

33. The method of claim 25 further comprising applying a variable delay responsive to said loop circuit output signal.

34. The method of claim 33 wherein said dividing is responsive to said variable delay.

35. The method of claim 25 wherein said comparing comprises one of (a) comparing phase and frequency and (b) comparing phase.

36. The method of claim 25 wherein said loop circuit output signal is responsive to a variable delay.

* * * * *